(12) United States Patent
Iwasaki et al.

(10) Patent No.: US 8,049,581 B2
(45) Date of Patent: Nov. 1, 2011

(54) PIEZOELECTRIC FILTER AND METHOD FOR MANUFACTURING THE SAME

(75) Inventors: Tomohiro Iwasaki, Osaka (JP); Hiroshi Nakatsuka, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 254 days.

(21) Appl. No.: 12/523,798

(22) PCT Filed: Nov. 19, 2008

(86) PCT No.: PCT/JP2008/003377
§ 371 (c)(1),
(2), (4) Date: Jul. 20, 2009

(87) PCT Pub. No.: WO2009/066448
PCT Pub. Date: May 28, 2009

(65) Prior Publication Data
US 2010/0052476 A1    Mar. 4, 2010

(30) Foreign Application Priority Data

Nov. 21, 2007  (JP) .................. 2007-301114

(51) Int. Cl.
*H03H 9/205*   (2006.01)
*H01L 41/04*   (2006.01)

(52) U.S. Cl. ........ 333/187; 333/189; 333/191; 310/312; 310/320

(58) Field of Classification Search .............. 333/187, 333/188, 189, 191; 310/312, 320
See application file for complete search history.

(56) References Cited

U.S. PATENT DOCUMENTS

| | | | |
|---|---|---|---|
| 6,441,539 B1 * | 8/2002 | Kitamura et al. | 310/346 |
| 6,617,249 B2 * | 9/2003 | Ruby et al. | 438/689 |
| 7,019,604 B2 * | 3/2006 | Gotoh et al. | 333/187 |
| 7,408,287 B2 | 8/2008 | Matsumoto et al. | |
| 7,408,428 B2 * | 8/2008 | Larson, III | 333/187 |
| 7,408,429 B2 * | 8/2008 | Iwasaki et al. | 333/187 |
| 7,414,349 B2 * | 8/2008 | Sasaki | 310/324 |

(Continued)

FOREIGN PATENT DOCUMENTS

JP    2002-237738    8/2002

(Continued)

OTHER PUBLICATIONS

English language Abstract of JP 2005-223479. Aug. 18, 2005.

(Continued)

*Primary Examiner* — Dean Takaoka
(74) *Attorney, Agent, or Firm* — Greenblum & Bernstein, P.L.C.

(57) ABSTRACT

A piezoelectric filter of the present invention is provided with first and second piezoelectric vibrators, each having a substrate, a lower load film formed on the substrate, a lower electrode formed on the lower load film, a piezoelectric element formed on the lower electrode, an upper electrode formed on the piezoelectric element and an upper load film formed on the upper electrode, and the piezoelectric filter is configured by electrically connecting the first and second piezoelectric vibrators to each other, and the piezoelectric element of the first piezoelectric vibrator and the piezoelectric element of the second piezoelectric vibrator correspond to respectively different areas of the same piezoelectric element; thus, the resonance frequencies of the first and second piezoelectric vibrators are adjusted by the respective lower load films and upper load films of the first piezoelectric vibrator and the second piezoelectric vibrator so that the resonance frequencies of the first and second piezoelectric vibrators are made different from each other.

13 Claims, 16 Drawing Sheets

U.S. PATENT DOCUMENTS

| | | | |
|---|---|---|---|
| 7,498,717 B2 | 3/2009 | Yokoyama et al. | |
| 7,868,522 B2 * | 1/2011 | Ruby | 310/346 |
| 2001/0054941 A1 | 12/2001 | Shibata et al. | |
| 2002/0014808 A1 | 2/2002 | Misu et al. | |
| 2002/0123177 A1 | 9/2002 | Ruby et al. | |
| 2004/0017269 A1 | 1/2004 | Gotoh et al. | |
| 2005/0168102 A1 | 8/2005 | Matsumoto et al. | |
| 2005/0218754 A1 | 10/2005 | Yokoyama et al. | |
| 2007/0069606 A1 | 3/2007 | Matsumoto et al. | |
| 2007/0090725 A1 | 4/2007 | Kamiyama et al. | |
| 2009/0001848 A1 | 1/2009 | Umeda et al. | |

FOREIGN PATENT DOCUMENTS

| | | |
|---|---|---|
| JP | 2002-335141 | 11/2002 |
| JP | 2004-112757 | 4/2004 |
| JP | 2005-223479 | 8/2005 |
| JP | 2005-286945 | 10/2005 |
| JP | 2007-143125 | 6/2007 |
| WO | 99/37023 | 7/1999 |
| WO | 2007 119556 | 10/2007 |
| WO | 2009/066448 | 5/2009 |

OTHER PUBLICATIONS

English language Abstract of JP 2007-143125. Jun. 7, 2007.
English language Abstract of JP 2002-237738. Aug. 23, 2002.
English language Abstract of JP 2005-286945. Oct. 13, 2005.
English language Abstract of JP 2002-335141. Nov. 22, 2002.
English language Abstract of JP 2004-112757. Apr. 8, 2004.

* cited by examiner

Fig. 14A        PRIOR ART
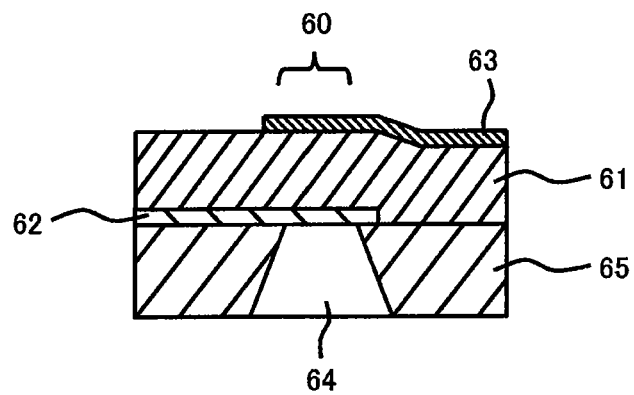
Fig. 14B        PRIOR ART
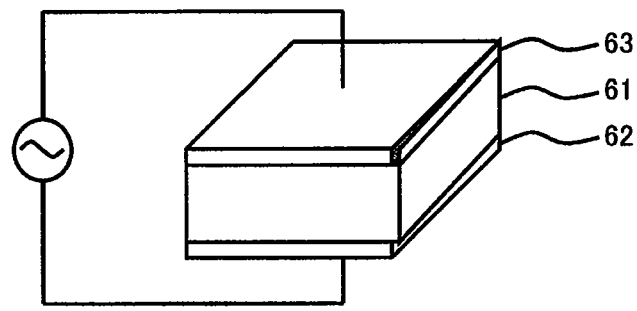
Fig. 14C        PRIOR ART
(a)             (b)
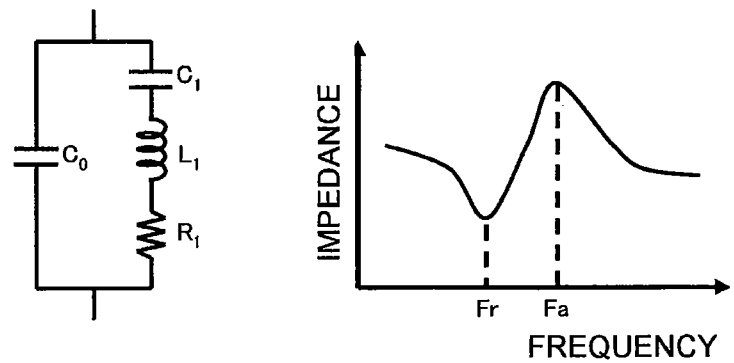

(THICKNESS OF LOWER LOAD FILM)
/(FILM THICKNESS OF PIEZOELECTRIC ELEMENT)

PIEZOELECTRIC FILTER AND METHOD FOR MANUFACTURING THE SAME

BACKGROUND OF THE INVENTION

1. Technical Field

This application claims priority based on Japanese Patent Application No. 2007-301114 filed on Nov. 21, 2007 in Japan, the entire contents of which are hereby incorporated in the present specification by reference.

The present invention relates to a piezoelectric filter using a piezoelectric vibrator and a method for manufacturing such a filter.

2. Background Art

There have been demands for small-size and light-weight parts as built-in parts to be used in an electronic apparatus such as a portable apparatus. For example, as a filter for use in a portable apparatus, a small-size filter, as well as a filter whose frequency characteristic can be precisely adjusted, has been required. A filter using a piezoelectric vibrator has been known as one of the filters that satisfy these demands.

Conventional piezoelectric vibrator will be described with reference to FIGS. 14A to 14C. FIG. 14A is a cross-sectional view that shows a basic structure of a conventional piezoelectric vibrator 60. The piezoelectric vibrator 60 has a resonance unit having a structure in which a piezoelectric element 61 is sandwiched by a lower electrode portion 62 and an upper electrode portion 63. This resonance unit is mounted on a substrate 65 with a cavity 64 formed therein. This cavity 64 can be formed by partially etching the substrate 65 from its rear face by using a micro-processing method.

As shown in FIG. 14B, the piezoelectric vibrator 60 applies an electric field in a thickness direction to the piezoelectric element 61 by the lower electrode portion 62 and the upper electrode portion 63 so that vibrations in the thickness direction are generated. The following description will discuss operations of the piezoelectric vibrator 60 by reference to thickness longitudinal vibrations of an endless flat plate. In the piezoelectric vibrator 60, when an electric field is applied between the lower electrode portion 62 and the upper electrode portion 63, electric energy is converted to mechanical energy in the piezoelectric element 61. The induced mechanical vibrations are extending vibrations in the thickness direction, and cause expansions and shrinkages in the same direction as that of the electric field. In general, the piezoelectric vibrator 60 is operated by utilizing resonance vibrations in the thickness direction of the piezoelectric element 61 to give resonance having a frequency the half-wavelength of which corresponds to the thickness. The cavity 64 shown in FIG. 14A is utilized so as to ensure the thickness longitudinal vibrations of the piezoelectric element 61.

As shown in FIG. 14C (a), the equivalent circuit of the piezoelectric vibrator 60 is allowed to have both of series resonance and parallel resonance. More specifically, the circuit is formed by a series resonator unit configured by a capacitor C1, an inductor L1 and a resistor R1 and a capacitor C0 that is connected in parallel to the series resonance unit. By using this circuit structure, the admittance frequency characteristic of the equivalent circuit has a maximum admittance at a resonance frequency fr and a minimum admittance at an anti-resonance frequency fa, as shown in FIG. 14C (b). Here, the resonance frequency fr and the anti-resonance frequency fa have the following relationships.

$$fr = 1/\{2\pi\sqrt{(L1 \times C1)}\}$$

$$fa = fr\sqrt{(1+C1/C0)}$$

In the case where the piezoelectric vibrator 60 having such an admittance frequency characteristic is applied as a filter, since the resonance vibrations of the piezoelectric element 61 are utilized, a small size filter with a low loss can be achieved. As shown in FIG. 15, two piezoelectric vibrators 71 and 72 are connected in series with, as well as in parallel with each other so that, as shown in FIG. 16, a band-pass filter that allows the resonance frequency of the series piezoelectric vibrators and the anti-resonance frequency of the parallel piezoelectric vibrators to be made virtually coincident with each other can be easily configured. However, in order to make the frequencies coincident with each other, it is necessary to design the parallel piezoelectric vibrators so as to have a frequency lower than that of the series piezoelectric vibrators, as a whole. Here, Japanese Patent Laid-open Publication No. 2002-335141, Japanese Patent Laid-open Publication No. 2005-223479 and the like have disclosed inventions for carrying out such frequency adjustments.

Referring to FIG. 17, the following description will discuss a conventional frequency-adjusting method disclosed in Japanese Patent Laid-open Publication No. 2002-335141. This method uses a general mass load structure as one of frequency-adjusting methods. FIG. 17 is a cross-sectional view that shows a structure of a piezoelectric filter using two piezoelectric vibrators.

In order to manufacture resonators 140 and 150 on a substrate 132, a first bottom electrode 142 and a second bottom electrode 152 are formed, and these electrodes respectively bridge over a first void 141 and a second void 151. Next, a piezoelectric (PZ) layer 134 is formed over both of the first and second bottom electrodes 142 and 152, and the PZ layer 134 has a first portion 144 located on the first bottom electrode 142 and a second portion 154 located on the second bottom electrode 152. Next, a surface electrode layer 136 is formed, and the surface electrode 136 has a first section 146 formed on the first portion 144 and a second section 156 formed on the second portion 154. Next, a surface load film 138 is formed on the first section 146 so as to desirably cover the entire first section 146. The surface load film 138 includes a conductive material or an insulating material, or both of these, and although not particularly limited, the material includes molybdenum, aluminum nitride, or silicon dioxide. Next, the surface load film 138 is over-etched to form a first surface electrode (combination of the etched surface load film 148 and the first section 146 (148+146)). In other words, the surface load film 138 and the surface electrode layer 136 are simultaneously etched to form the first surface electrode (148+146). A second surface electrode 156 can be made by the same processes as those for forming the first surface electrode (148+146). Since no load electrode exists on the second surface section 156 of the surface electrode layer 136, the second surface electrode 156 is formed, with the second section 156 being left, while the surface electrode layer 136 is etched so as to eliminate all the other portions of the surface electrode layer 136, with the first surface electrodes (148+146) being left. With this structure, in the first resonator 140, a greater mass load is applied thereto in comparison with that applied on the second resonator 150 because of the portion corresponding to the surface load film 148. Thus, the first resonator 140 has a reduction in the frequency so that the first resonator 140 and the second resonator 150 are made different in their frequencies.

Next, FIG. 18 shows another frequency adjusting method disclosed in Japanese Patent Laid-open Publication No. 2005-223479. In the same manner as in Japanese Patent Laid-open Publication No. 2002-335141, this method uses a general mass load structure as one of the frequency adjusting methods. FIG. 18 is a cross-sectional view showing a piezoelectric filter using two piezoelectric vibrators. In FIG. 18, a formation area for a first thin-film bulk vibrator 111 is referred to as a first area, and a formation area for a second thin-film bulk vibrator 112 is referred to as a second area. The diaphragm structures of the thin-film bulk vibrators are respectively formed on voids 109 and 110 formed on the rear face side of a single substrate, and include a base layer 102 of the first area and a base layer 121 of the second area, a lower electrode layer 103 of the first area and a lower electrode layer 104 of the second area, a piezoelectric layer 105 of the first area and a piezoelectric layer 106 of the second area, and an upper electrode layer 107 of the first area and an upper electrode layer 108 of the second area. The film thickness t2 of the base layer 121 of the diaphragm structure of the second area is made thicker than the film thickness t1 of the base layer 102 of the diaphragm structure of the first area. Therefore, the film thickness T2 of the diaphragm structure of the second area including the base layer 121 is thicker than the film thickness T1 of the diaphragm structure of the first area including the base layer 102, and consequently, the resonance frequency of the second thin-film bulk vibrator 112 is made lower than the resonance frequency of the first thin-film bulk vibrator 111.

In the inventions disclosed in Japanese Patent Laid-open Publication No. 2002-335141 and Japanese Patent Laid-open Publication No. 2005-223479, a desired resonance frequency is achieved by adding a mass load effect to a piezoelectric vibrator, and a filter can be formed by realizing piezoelectric vibrators having a plurality of different resonance frequencies.

However, in the piezoelectric vibrators disclosed in Patent Documents 1 and 2, a load film is formed only on one face of an optimal piezoelectric vibrator shown in FIG. 19A so as to carry out the frequency adjustment. FIG. 19B shows a structure in which a load film 85 is formed beneath a lower electrode 82. In the optimal piezoelectric vibrator shown in FIG. 19A, since the two faces in the vertical direction are made in contact with the free space, the two faces serve as free ends so that on the basic mode, vibrations are exerted with ½ of a wavelength, with the center of a piezoelectric element 81 in the thickness direction serving as the node of the vibrations. At this time, energy to be used in the piezoelectric element 81 is maximized, and the effective coupling coefficient of the piezoelectric vibrator is also maximized. However, as shown in FIG. 19B, in the case where the load film 85 is formed only on one of the faces, the node of vibrations is changed in the direction in which the load film is formed. At this time, the energy to be utilized in the piezoelectric element 81 is reduced, with the result that the coupling coefficient deteriorates. FIG. 19C shows the results of numeric calculations of the size of the coupling coefficient relative to the film thickness of the load film. The axis of abscissas indicates the thickness of the load film 85 standardized by the film thickness of the piezoelectric element 81, and the axis of ordinates indicates the coupling coefficient. Here, AlN is used as the piezoelectric element, Mo is used as the electrode, and $SiO_2$ is used as the load film. As shown in FIG. 19C, it is found that as the thickness of the load film 85 becomes greater, the coupling coefficient greatly deteriorates. In the case where this is used in a W-CDMA system (2 GHz band) of a portable telephone, the thickness of the piezoelectric element is about 1 μm, and a desired amount of frequency adjustment (thickness of the load film) is about 0.5 μm, with the result that the coupling coefficient is lowered by about 15% in comparison with that of the optimal piezoelectric vibrator.

In FIGS. 19A-19C, the explanation is given by exemplifying a structure in which the load film is formed only beneath the lower electrode; however, the same results are obtained in the case where the load film is formed only on the upper electrode.

Therefore, an object of the present invention is to provide a frequency adjusting method in which the degree of degradation of the coupling coefficient is improved.

Moreover, as a method for manufacturing a conventional thin-film bulk acoustic wave resonator (FBAR: Film Bulk Acoustic wave Resonator) filter, a manufacturing method using a transferring technique has been disclosed. When the conventional frequency adjusting methods of Patent Documents 1 and 2 are applied to this manufacturing method, degradation of the yield occurs.

Therefore, another object of the present invention is to provide a frequency adjusting method by which the degree of degradation of the coupling coefficient is suppressed. Moreover, still another object is to provide a method for suppressing the degradation of the yield in the manufacturing method using the transferring technique.

A piezoelectric filter having a first structure of the present invention is provided with: first and second piezoelectric vibrators, each having: a substrate; a lower load film formed on the substrate; a lower electrode formed on the lower load film; a piezoelectric element formed on the lower electrode; an upper electrode formed on the piezoelectric element; and an upper load film formed on the upper electrode, wherein the piezoelectric filter is formed by electrically connecting the first and second piezoelectric vibrators. In this structure, resonance frequencies of the first and second piezoelectric vibrators are adjusted by the respective lower load film and upper load film so that the resonance frequencies of the first and second piezoelectric vibrators are made different from each other.

A method for manufacturing a piezoelectric filter having a first structure of the present invention includes the steps of: forming an upper electrode on one of main faces of a piezoelectric element; forming a lower electrode on the other main face of the piezoelectric element; forming an upper load film on a face opposing the face of the upper electrode on which the piezoelectric element is formed; and forming a lower load film on a face opposing the face of the lower electrode on which the piezoelectric element is formed, and this method is characterized in that, in the first and second piezoelectric vibrators to be formed, the thicknesses of the respective upper load film and lower load film are adjusted so that the resonance frequencies of the first and second piezoelectric vibrators are made different from each other.

A piezoelectric filter having a second structure of the present invention is provided with: a first piezoelectric vibrator formed with a first area of a piezoelectric element being interposed therebetween, and a second piezoelectric vibrator formed with a second area of the piezoelectric element being interposed therebetween, which are electrically connected to each other, and in this structure, the first piezoelectric vibrator is provided with:
a lower electrode formed on one of main faces of the first area of the piezoelectric element;
a lower load film formed on a face opposing a face of the lower electrode that is made in contact with the piezoelectric element;
an upper electrode formed on the other main face of the first area of the piezoelectric element; and
an upper load film formed on a face opposing a face of the upper electrode that is made in contact with the piezoelectric element, and the second piezoelectric vibrator is provided with:

a lower electrode formed on one of main faces of the second area of the piezoelectric element;

a lower load film formed on a face opposing a face of the lower electrode that is made in contact with the piezoelectric element;

an upper electrode formed on the other main face of the second area of the piezoelectric element; and an upper load film formed on a face opposing a face of the upper electrode that is made in contact with the piezoelectric element, and the piezoelectric filter is characterized in that resonance frequencies of the first and second piezoelectric vibrators are adjusted by the respective lower load films and upper load films of the first piezoelectric vibrator and the second piezoelectric vibrator so that the resonance frequency of the first piezoelectric vibrator and the resonance frequency of the second piezoelectric vibrator are made different from each other.

A method for manufacturing a piezoelectric filter a second structure of the present invention is directed to a method for manufacturing a piezoelectric filter provided with: a first piezoelectric vibrator formed with a first area of a piezoelectric element being interposed therebetween, and a second piezoelectric vibrator formed with a second area of the piezoelectric element being interposed therebetween, wherein the step of forming the first piezoelectric vibrator, with the first area of the piezoelectric element being interposed therebetween, further includes:

forming an upper electrode on one of main faces of the first area of the piezoelectric element;

forming a lower electrode on the other main face of the first area of the piezoelectric element;

forming an upper load film on a face opposing a face of the upper electrode that is made in contact with the piezoelectric element; and forming a lower load film on a face opposing a face of the lower electrode that is made in contact with the piezoelectric element, and wherein the step of forming the second piezoelectric vibrator, with the second area of the piezoelectric element being interposed therebetween, further includes:

forming an upper electrode on one of main faces of the second area of the piezoelectric element;

forming a lower electrode on the other main face of the second area of the piezoelectric element;

forming an upper load film on a face opposing a face of the upper electrode that is made in contact with the piezoelectric element; and forming a lower load film on a face opposing a face of the lower electrode that is made in contact with the piezoelectric element, and wherein, in the step of forming the respective upper load film or lower load film of the first piezoelectric vibrator and the second piezoelectric vibrator, or in the succeeding step thereof, the thicknesses of the upper load film and the lower load film are adjusted so that a resonance frequency of the first piezoelectric vibrator and a resonance frequency of the second piezoelectric vibrator are made different from each other.

Here, another arrangement may be made in which the thicknesses of the upper load film of the first piezoelectric vibrator and the upper load film of the second piezoelectric vibrator are made equal to each other and the thicknesses of the lower load film of the first piezoelectric vibrator and the lower load film of the second piezoelectric vibrator are made different from each other.

Moreover, the upper load film of the first piezoelectric vibrator and the upper load film of the second piezoelectric vibrator may be made from the same material. The lower load film of the first piezoelectric vibrator and the lower load film of the second piezoelectric vibrator may be made from the same material.

Furthermore, supposing that the thickness of the upper load film of each of the first and second piezoelectric vibrators is Ta, the thickness of the lower load film of the first piezoelectric vibrator is Tb, the thickness of the lower load film of the second piezoelectric vibrator is Tc, the sound velocity of the upper load film of each of the first and second piezoelectric vibrators is va, and the sound velocity of the lower load film of each of the first and second piezoelectric vibrators is vb, Ta may be made greater than Tb×va/vb, and also made smaller than Tc×va/vb.

Moreover, by respectively adjusting the thickness of the lower load film of the first piezoelectric vibrator and the thickness of the lower load film of the second piezoelectric vibrator, the resonance frequencies of the first and second piezoelectric vibrators may be adjusted;

the first and second piezoelectric vibrators are formed on the substrate with a supporting portion interposed therebetween;

the supporting portion is formed by joining a first supporting portion formed on the substrate to a second supporting portion formed on a non-adjusted area in which the thicknesses of the lower load films of the first and second piezoelectric vibrators are unadjusted; and an adjusted area in which the thicknesses of the lower load films of the first and second piezoelectric vibrators are adjusted may be made to face the substrate, with a void portion being interposed therebetween.

Moreover, by respectively adjusting the thickness of the lower load film of the first piezoelectric vibrator and the thickness of the lower load film of the second piezoelectric vibrator, the resonance frequencies of the first and second piezoelectric vibrators may be adjusted;

the first and second piezoelectric vibrators are formed on the substrate with a supporting portion interposed therebetween;

the supporting portion is formed by a non-adjusted area in which the thicknesses of the lower load films are unadjusted, and the non-adjusted area of the lower load films and the substrate are directly joined to each other; and an adjusted area in which the thicknesses of the lower load films of the first and second piezoelectric vibrators are adjusted may be allowed to face the substrate, with a void portion being interposed therebetween.

In accordance with the piezoelectric vibrator of the present invention, since the node of vibration mode is made closer to the center of the piezoelectric vibrator in comparison with the conventional frequency adjusting method, energy can be efficiently utilized so that a superior coupling coefficient can be achieved. Moreover, in the case where the frequency adjusting method of the present invention is applied to a transferring technique, adjustments for realizing desired frequency intervals can be carried out prior to the transferring operation (prior to formation of a void portion) so that, by reducing the number of processes after the transferring operation, degradation of the yield can be suppressed.

BRIEF DESCRIPTION OF THE DRAWINGS

FIG. 14A is a cross-sectional view that shows a structure of a conventional piezoelectric vibrator.

FIG. 14B is a perspective view that shows a structure of the conventional piezoelectric vibrator.

FIG. 14C(a) is an equivalent circuit diagram showing a conventional piezoelectric vibrator, and FIG. 14C(b) is a diagram that shows an admittance frequency characteristic of the piezoelectric vibrator.

PREFERRED EMBODIMENT OF THE INVENTION

Figure 1A:
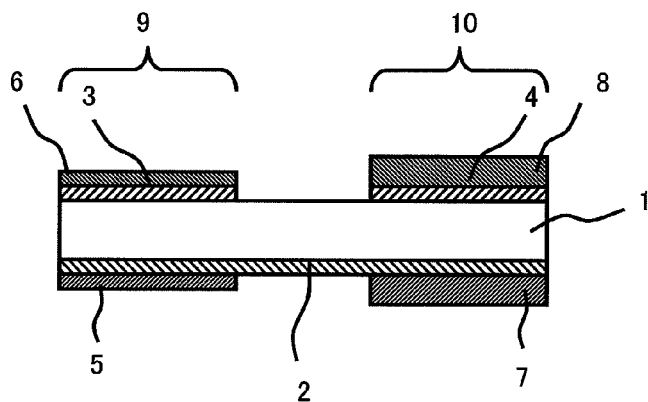
FIG. 1A is a cross-sectional view showing a vibration unit of a piezoelectric filter in accordance with a first embodiment of the present invention.

In the case where the upper load film and the lower load film are made from the same material, the thicknesses of the upper load film and the lower load film may be made equal to each other.

Moreover, the upper load film of the first piezoelectric vibrator and the upper load film of the second piezoelectric vibrator may be made to have the same thickness, while the lower load film of the first piezoelectric vibrator and the lower load film of the second piezoelectric vibrator may be made to have different thicknesses.

In this case, supposing that the thickness of the upper load film is Ta, the thickness of the lower load film of the first piezoelectric vibrator is Tb, the thickness of the lower load film of the second piezoelectric vibrator is Tc, the sound velocity of the upper load film is va, and the sound velocity of the lower load film is vb, Ta is preferably made greater than Tb×va/vb, and also made smaller than Tc×va/vb.

The upper load films of the first and second piezoelectric vibrators and the lower load films of the first and second piezoelectric vibrators are preferably formed by using the same material. Alternatively, the upper load films of the first and second piezoelectric vibrators and the lower load films of the first and second piezoelectric vibrators may be formed by using different materials.

Void portions may be formed between the substrate and the first and second piezoelectric vibrators. The void portions may be formed by using a transferring technique.

Referring to the drawings, the following description will discuss embodiments of the present invention.

First Embodiment

Figure 1B:
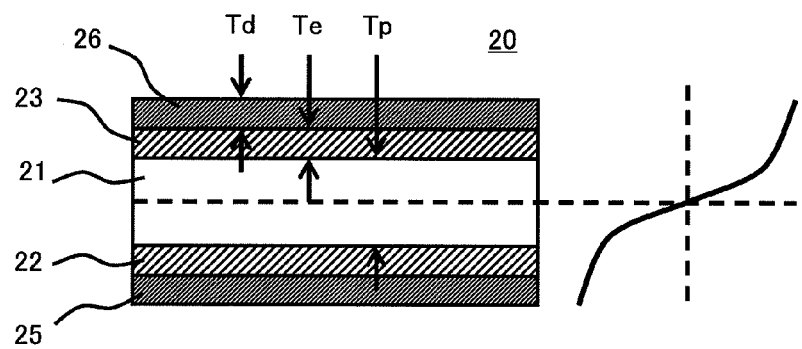
FIG. 1B is a cross-sectional view showing a vibration unit of a piezoelectric vibrator in accordance with the first embodiment of the present invention.
Figure 1C:
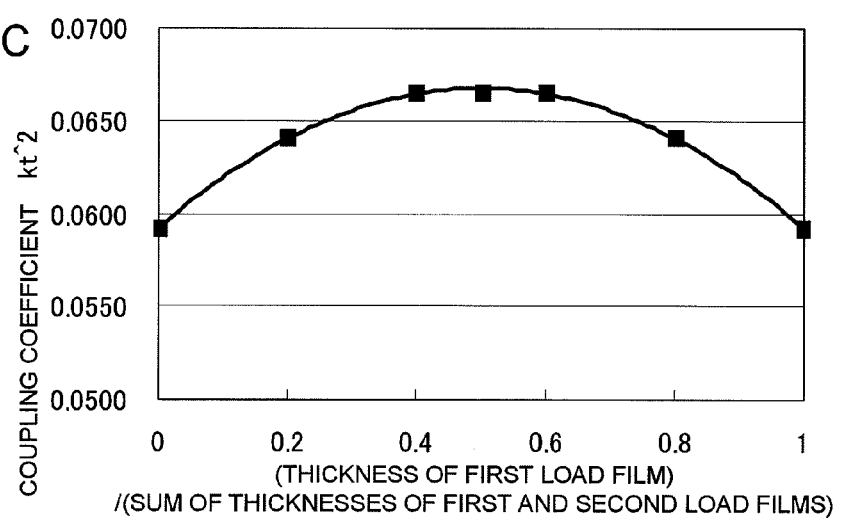
FIG. 1C shows results of simulation that indicate effects of the piezoelectric vibrator in accordance with the first embodiment of the present invention.

FIG. 1A is a cross-sectional view that shows a structural example of a piezoelectric filter in accordance with a first embodiment of the present invention. FIG. 1B shows a cross-sectional view of a piezoelectric vibrator contained in the piezoelectric filter shown in FIG. 1A and a diagram that shows a vibration mode thereof. FIG. 1C is a graph that shows the results of calculations of a coupling coefficient, in the case where the ratio of the thicknesses of the upper and lower load films of the piezoelectric vibrator shown in FIG. 1B is changed. Here, the calculations are carried out, for example, supposing that the same material is used as the upper and lower load films. The piezoelectric filter in accordance with the present embodiment has a cross-sectional structure as shown in FIG. 1A. That is, on one of areas of a piezoelectric element 1, a lower electrode 2 is formed on its lower portion, with a lower load film 5 (first load film) being formed on its further lower portion, while an upper electrode 3 is formed on its upper portion, with an upper load film 6 (second load film) being formed on its further upper portion, so that a first piezoelectric vibrator 9 is configured. Moreover, on an area different from the above-mentioned area of the piezoelectric element 1, a lower electrode 2 is formed on its lower portion, with a lower load film 7 (third load film) being formed on its further lower portion, while an upper electrode 4 is formed on its upper portion, with an upper load film 8 (fourth load film) being formed on its further upper portion; thus, a second piezoelectric vibrator 10 is configured. In other words, the first and second piezoelectric vibrators 9 and 10 are arranged, with the respectively different areas of the piezoelectric element 1 being sandwiched therebetween.

The lower electrode 2 and the upper electrode 3 are formed by a metal material, for example, such as molybdenum (Mo). The piezoelectric element 1 is formed by a piezoelectric material, for example, such as aluminum nitride (AlN).

As shown in FIG. 1A, by forming load films on both of the main faces in the thickness direction of the first and second piezoelectric vibrators 9 and 10, it becomes possible to further reduce degradation of the coupling coefficient in comparison with a conventional frequency-adjusting method. Referring to FIGS. 1B and 1C, the following description will discuss the mechanism thereof.

As shown in FIG. 1B, a piezoelectric vibrator 20 has a structure in which a lower electrode 22 and an upper electrode 23 are formed on both of the main faces of a piezoelectric element 21, with a load film 25 being formed on a lower portion of the lower electrode 22 and a load film 26 being formed on an upper portion of the upper electrode. In this case, in the case where the materials and thicknesses of the upper and lower electrodes 22 and 23 are the same, and the materials and thicknesses of the upper and lower load films 25 and 26 are also the same, its vibration mode is made symmetrical relative to the thickness direction. In other words, the node of the vibration mode is located in the center in the thickness direction of the piezoelectric element 21, with its coupling coefficient being made greatest.

Here, at this time, the resonance frequency f is determined as follows:
(a) First, supposing that the sound velocity of the piezoelectric element 21 is vp and the thickness is Tp, the resonance wavelength λp of the piezoelectric element is represented by vp/f.
(b) Next, supposing that the sound velocity of the upper and lower electrodes 22 and 23 is ve and the thickness is Te, the resonance wavelength λe of the electrode is represented by ve/f.
(c) Supposing that the sound velocity of the upper and lower load films 25 and 26 is vd and the thickness is Td, the resonance wavelength λd of the load film is represented by vd/f.
(d) Therefore, since the piezoelectric element has a resonance wavelength of Tp/λp times as long, each electrode has a resonance wavelength of Te/λe times as long, and each load film has a resonance wavelength of Td/λd times as long, the resonance frequency f is determined so as to satisfy the following expression:

$$Tp/\lambda p + Te/\lambda e \times 2 + Td/\lambda d \times 2 = 1/2$$

Consequently, the above-mentioned expression is rewritten into the following expression that includes the resonance frequency f:

$$Tp/vp + (Te/ve) \times 2 + (Td/vd) \times 2 = 1/(2 \times f)$$

Based upon this expression, the resonance frequency f is determined.

In FIG. 1C, in the piezoelectric vibrator shown in FIG. 1B, the rate of the thickness of the lower load film 25 relative to the sum of thicknesses of the lower load film 25 and upper load film 26 is plotted on the axis of abscissas, while the coupling coefficient of the piezoelectric vibrator shown in FIG. 1B is plotted on the axis of ordinates. More specifically, when the axis of abscissas indicates 0, the coupling coefficient in the case where only the upper load film 26 is used, without the lower load film 25, is indicated; in contrast, in the case where the axis of abscissas indicates 1, the coupling coefficient in the case where only the lower load film 25 is used, without the upper load film 26, is indicated. These two points are the same as those obtained by a conventional structure. As shown in FIG. 1C, by forming the load films 25 and 26 on both of the upper and the lower portions, it is found that the coupling coefficient becomes greater than that of a conventional structure. More specifically, when the axis abscissas indicates 0.5, that is, as described above, when the thicknesses of the lower load film 25 and the upper load film 26 are equal to each other, the coupling coefficient becomes greatest.

Here, the above-mentioned upper and lower load films 5, 6, 7 and 8 may be formed by a conductive material, or may be formed by an insulating material, such as $SiO_2$.

Figure 2:
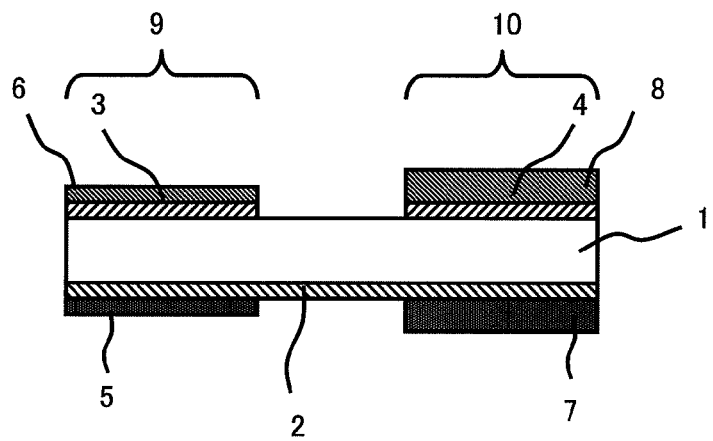
FIG. 2 is a cross-sectional view showing a vibration unit of another piezoelectric filter in accordance with the first embodiment of the present invention.

Here, as shown in FIG. 2, the lower load film 5 and the upper load film 6 of the first piezoelectric vibrator 9, or the lower load film 7 and the upper load film 8 of the second piezoelectric vibrator 10, may be formed by using respectively different materials. In this case, however, the different materials have different sound velocities. Here, supposing that the sound velocity of the lower load films 5 and 7 is vd1 and the thickness is Td1, with the sound velocity of the upper load films 6 and 8 being set to vd2 and the thickness thereof being set to Td2, by determining the respective thicknesses of the lower load films 5, 7 and the upper load films 6, 8 so as to satisfy Td1/Td2=vd1/vd2, it becomes possible to set the node in the center of the piezoelectric element.

In FIG. 1A, the lower electrode 2 is commonly used in the first piezoelectric vibrator and the second piezoelectric vibrator; however, not the lower electrode, but the upper electrode may be commonly used. However, in the case where both of the electrodes are commonly used, since operations are carried out as a single piezoelectric vibrator, one of the electrodes needs to be always electrically separated from the other.

Figure 3:
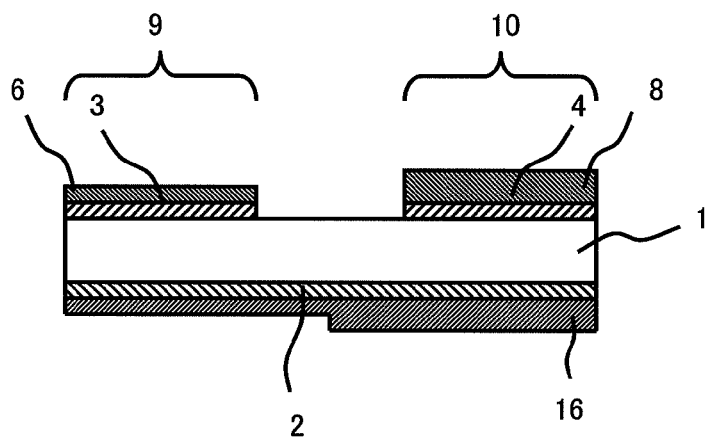
FIG. 3 is a cross-sectional view showing a vibration unit of still another piezoelectric filter in accordance with the first embodiment of the present invention.

Here, in the first and second piezoelectric vibrators, the load film, formed on the side having the commonly-used electrode, for example, as shown in FIG. 3, the load film 15 on the lower side of the lower electrode may be formed by using the same material as that of the first and second piezoelectric vibrators 9 and 10, with its thickness being different from each other.

Figure 4:
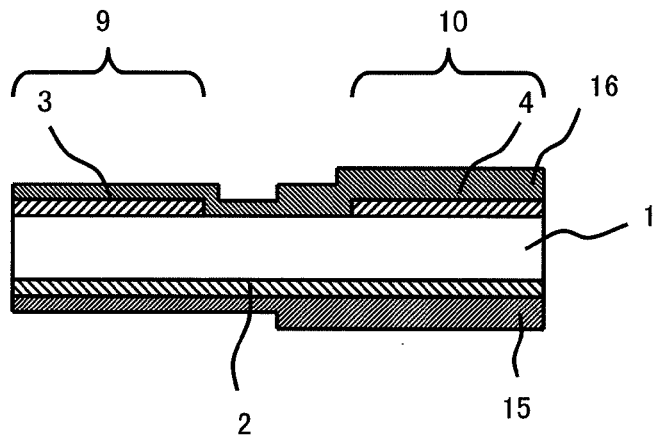
FIG. 4 is a cross-sectional view showing a vibration unit of yet another piezoelectric filter in accordance with the first embodiment of the present invention.

Here, in the case where the load film 16 on the upper side of the upper electrodes 3 and 4 is made from an insulating material, as shown in FIG. 4, the load film, formed on the side having the separated electrodes, may be formed by a commonly-used material, with its thickness different from each other between the first and second piezoelectric vibrators 9 and 10. When an insulating material is used, the upper electrodes are allowed to maintain electrically separated states as described above.

Figure 5:
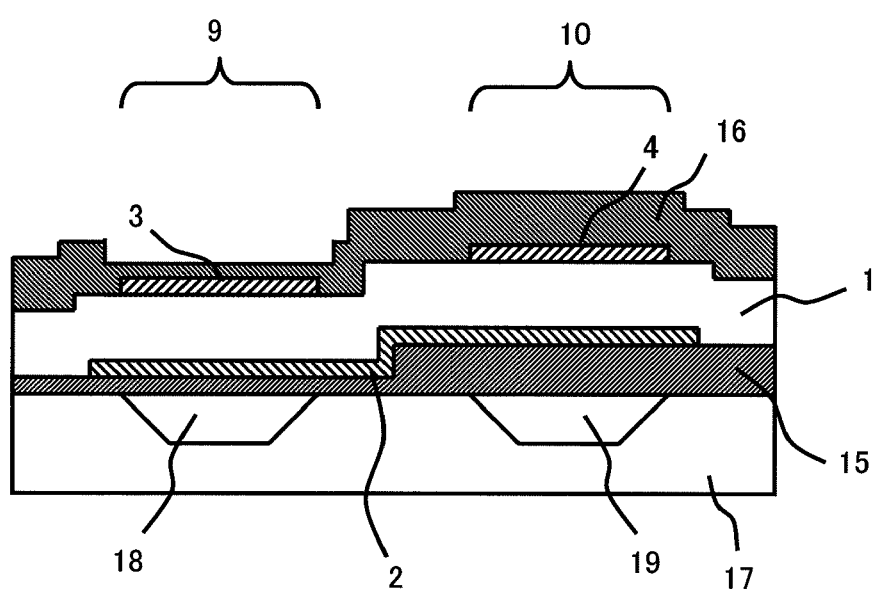
FIG. 5 is a cross-sectional view showing a supporting structure of yet another piezoelectric filter in accordance with the first embodiment of the present invention.

The above explanation has been given by utilizing a piezoelectric vibrator within the free space; however, actually, it is configured so as to be supported on a substrate. FIG. 5, for example, shows a cross-sectional view of the supporting structure of FIG. 4. As shown in FIG. 5, on a substrate 17, a lower load film 15 (first load film), a lower electrode 2, a piezoelectric element 1, an upper electrode 3 and an upper load film 16 (second load film) are arranged so that a first piezoelectric vibrator 9 is configured and supported thereon. Moreover, on another area of the substrate 17, a lower load film 15 (first load film), a lower electrode 2, a piezoelectric element 1, an upper electrode 4 and an upper load film 16 (second load film) are arranged so that a second piezoelectric vibrator 10 is configured and supported thereon. The thicknesses of the upper load film 15 and the lower load film 16 are formed so as to be different from each other on the first and second piezoelectric vibrators 9 and 10. Moreover, void portions 18 and 19 are formed below the first and second piezoelectric vibrators 9 and 10 so that vibration is ensured in the same manner as in the free space.

The above explanation has exemplified a structure in which the void portions 18 and 19 are formed in the substrate 17; however, another structure in which void portions are formed by penetrating the substrate, or still another structure in which void portions are formed between the substrate 17 and the lower load film 15, may be adopted.

Here, as the means for ensuring vibration similar to that in the free space, another structure in which an acoustic mirror layer is formed between the substrate 17 and the lower load film 15 may be adopted.

<Method for Measuring Sound Velocity>

The sound velocities of the upper and lower load films and the like can be measured by using a generally-known sound-velocity measuring method. For example, the sound velocity can be determined by using an elastic modulus measuring method and a resonance measuring method described below. The measuring methods described below are only examples, and the present invention is not intended to be limited by these. Moreover, it is needless to say that another measuring method may be used as long as it is a normally-used measuring method for sound velocity.

a) Elastic Modulus Measuring Method

The sound velocity can be defined by the following expression in which Young's modulus and the density are utilized.

$$v = \sqrt{\frac{E}{\rho}}$$

v: sound velocity, E: Young's modulus, ρ: density

Here, in general, Young's modulus is obtained by measuring an amount of strain in material derived from a push-in test and a tensile test. Moreover, the density can be obtained by using a normal measuring method. By using the obtained Young's modulus and density, it is possible to obtain a sound velocity.

b) Resonance Measuring Method

As described earlier, the resonance frequency f of a resonator, shown in FIG. 1B, is allowed to satisfy the following relational expression among the thicknesses Tp, Te and Td of films forming the resonator and sound velocities vp, ve and vd:

$$Tp/vp + Te/ve \times 2 + Td/vd \times 2 = 1/2 \times f$$

vp: sound velocity of piezoelectric element, Tp: thickness of piezoelectric element
ve: sound velocity of upper and lower electrodes, Te: thickness of upper and lower electrodes
vd: sound velocity of upper and lower load films, Td: thickness of upper and lower load films Here, the prerequisites of the above-mentioned relational expression are that the upper and lower electrodes are made from the same material and that the upper and lower load films are made from the same material.

In accordance with the above-mentioned relational expression, as the thickness of any one of the films forming the resonator changes, the resonance frequency f also changes.

For example, with the thickness Td of a load film to be measured being changed by ΔTd, the difference Δf of the resonance frequency f is measured so that the sound velocity vd of the load film is calculated from the following expression.

$$vd = -4 \times \Delta Td \times f \times (f + \Delta f)/\Delta f$$

Second Embodiment

Figure 6:
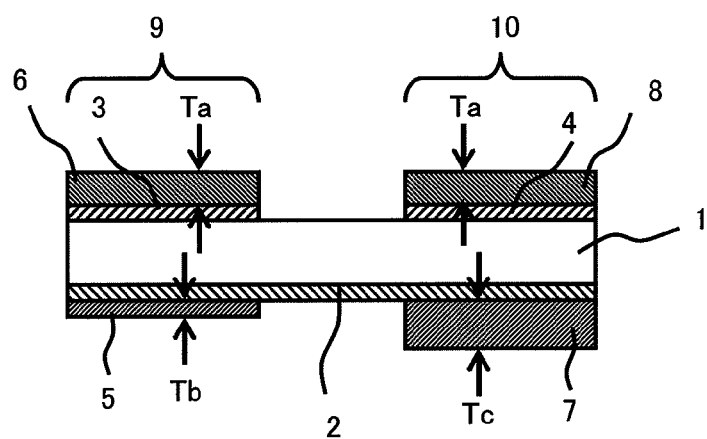
FIG. 6 is a cross-sectional view showing a vibration unit of a piezoelectric filter in accordance with a second embodiment of the present invention.

FIG. 6 is a cross-sectional view that shows a structure of a piezoelectric filter in accordance with a second embodiment of the present invention. As shown in FIG. 1C of the first embodiment of the present invention, by forming load films on the upper and lower faces of a piezoelectric vibrator, it becomes possible to improve the coupling coefficient in comparison with that of a conventional structure. As shown in FIG. 6, a lower electrode 2 is formed on a lower load film 5 (first load film), a piezoelectric element 1 is formed on the lower electrode 2, an upper electrode 3 is formed on the piezoelectric element 1 and an upper load film 6 (second load film) is formed on the upper electrode 3 so that a first piezoelectric vibrator 9 is configured. In this case, the thicknesses of the lower load film 5 and the upper load film 6 may be different from each other. Moreover, the lower electrode 2 is formed on a lower load film 7 (third load film), the piezoelectric element 1 is formed on the lower electrode 2, an upper electrode 4 is formed on the piezoelectric element 1 and an upper load film 8 (fourth load film) is formed on the upper electrode 4 so that a second piezoelectric vibrator 10 is configured. In this case, the thicknesses of the lower load film 7 and the upper load film 8 may be different from each other. In this case, with respect to each of the areas of the piezoelectric element 1, the film thicknesses of the mutual load films on one of faces, for example, the respective upper load films (second load film 6 and fourth load film 8) are made from the same material, with the same film thickness, through the same process so that it becomes possible to reduce the number of the processes.

Here, supposing that the thicknesses of the respective electrodes and the thickness of the piezoelectric elements in the first and second piezoelectric vibrators 9 and 10 are the same, the wavelength of the upper load films 6 and 8 is λa, the thickness thereof is Ta, the wavelength of the lower load film 5 is λb, the thickness thereof is Tb, the wavelength of the lower load film 7 is λc and the thickness thereof is Tc, By setting Ta/λa to a value that is greater than Tb/λb, but smaller than Tc/λc, it becomes possible to reduce the number of processes, without causing a great reduction in the coupling coefficient of the first and second piezoelectric vibrators 9 and 10. The above-mentioned relationship is represented by the following relational expression.

$$Tb/\lambda b < Ta/\lambda a < Tc/\lambda c$$

By substituting relationships, λa=va/f, λb=vb/f and λc=vc/f, into the above-mentioned relational expression, the following expression is obtained.

$$Tb/(vb/f) < Ta/(va/f) < Tc/(vc/f)$$

This expression is further arranged to obtain the following relational expression:

$$Tb \times (va/vb) < Ta < Tc \times (va/vc)$$

Here, since the material forming the upper load film 6 of the first piezoelectric vibrator 9 and the material forming the upper load film 8 of the second piezoelectric vibrator 10 are the same, the respective upper load films 6 and 8 have the same sound velocity va. Moreover, in the case where the material forming the lower load film 5 of the first piezoelectric vibrator 9 and the material forming the lower load film 7 of the second piezoelectric vibrator 10 are the same, the sound velocities vb and vc of the respective lower load films 5 and 7 are made to be the same value (vb=vc). In this case, the above-mentioned relational expression is arranged as shown below.

$$Tb \times (va/vb) < Ta < Tc \times (va/vb)$$

Moreover, in the case where all the load films are made from the same material, the sound velocities of all the load films are made to be the same value (va=vb). In this case, by adjusting the thicknesses of the respective load films so as to satisfy the relational expression Tb<Ta<Tc, it becomes possible to reduce the number of processes, without causing a great reduction in the coupling coefficient of each of the first and second piezoelectric vibrators 9 and 10. By setting the film thicknesses in the above-mentioned range, with a structure in which the thicknesses of the upper and lower load films are equal to each other (axis of abscissas: 0.5) serving as a border corresponding to an optimal point shown in FIG. 1C, it becomes possible to form a piezoelectric vibrator of 0.5 or less and a piezoelectric vibrator of 0.5 or more. With this arrangement, since the first piezoelectric vibrator 9 and the second piezoelectric vibrator 10 can be designed as close to the optimal point as possible, the reduction in the coupling coefficient can be made as small as possible.

Here, in FIG. 6, the lower electrode 2 is commonly used in the first piezoelectric vibrator and the second piezoelectric vibrator; however, not the lower electrode, but the upper side electrode may be commonly used. However, in the case where both of the electrodes are commonly used, since operations are carried out as a single piezoelectric vibrator, one of the electrodes needs to be always electrically separated from the other.

Here, in the first and second piezoelectric vibrators, the load film, formed on the side having the commonly-used electrode, for example, the lower load films 5 and 7, located on the lower side of the lower electrodes, may be formed in a single process, by using the same material, with different thicknesses, in the first and second piezoelectric vibrators 9 and 10.

Here, with respect to the load film on the side having the separated electrodes, for example, in the case where the upper load films 6 and 8 on the upper side of the upper electrodes 3 and 4 are made from an insulating material, these films may be formed through a single process, by using the same material, with different thicknesses, in the first and second piezoelectric vibrators 9 and 10. When an insulating material is used, the upper electrodes are allowed to maintain electrically separated states as described above.

Figure 7:
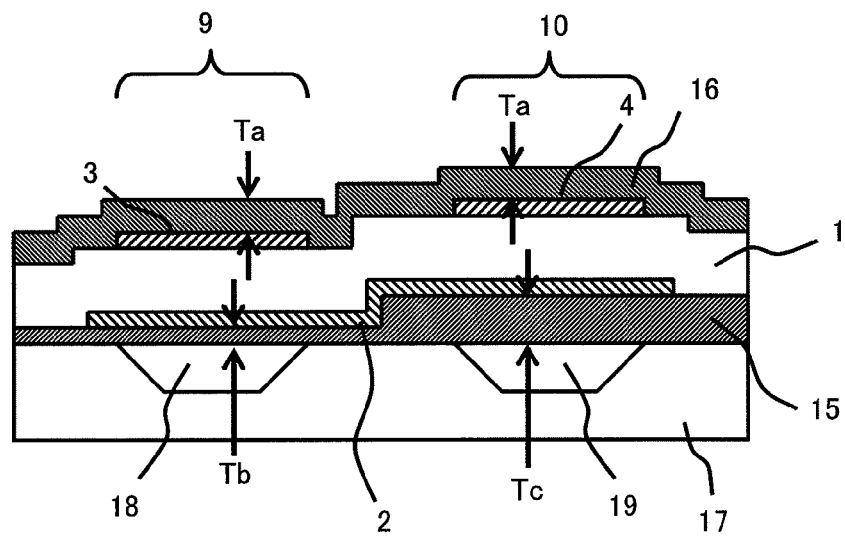
FIG. 7 is a cross-sectional view showing a supporting structure of the piezoelectric filter in accordance with the second embodiment of the present invention.

FIG. 7 is a cross-sectional view that shows a supporting structure of a piezoelectric filter in accordance with a second embodiment of the present invention. As shown in FIG. 7, on one of areas of a substrate 17, a lower load film 15 (first load film), a lower electrode 2, a piezoelectric element 1, an upper electrode 3 and an upper load film 16 (second load film) are formed so that a first piezoelectric vibrator 9 is configured and supported thereon. Moreover, on an area different from the above-mentioned area of the substrate 17, the lower load film 15 (first load film), the lower electrode 2, the piezoelectric element 1, an upper electrode 4 and the upper load film 16 (second load film) are formed so that a second piezoelectric vibrator 10 is configured and supported thereon. The thickness of the lower load film 15 of the first piezoelectric vibrator 9 and the thickness of the lower load film 15 of the second piezoelectric vibrator 10 are made different from each other. In contrast, the thickness of the upper load film 16 of the first piezoelectric vibrator 9 and the thickness of the upper load film 16 of the second piezoelectric vibrator 10 are made equal to each other. Moreover, between the lower load film 15 of the first and second piezoelectric vibrators 9, 10 and the substrate 17, void portions 18 and 19 are formed so that vibration is ensured in the same manner as in the free space.

The above explanation has exemplified a structure in which the concave-shaped void portions 18 and 19 are formed in the substrate 17; however, another structure in which void portions are formed by penetrating the substrate may be adopted.

Here, as the means for ensuring vibration similar to that in the free space, another structure in which an acoustic mirror layer is formed between the substrate 17 and the lower load film 15 may be adopted.

Figure 8:
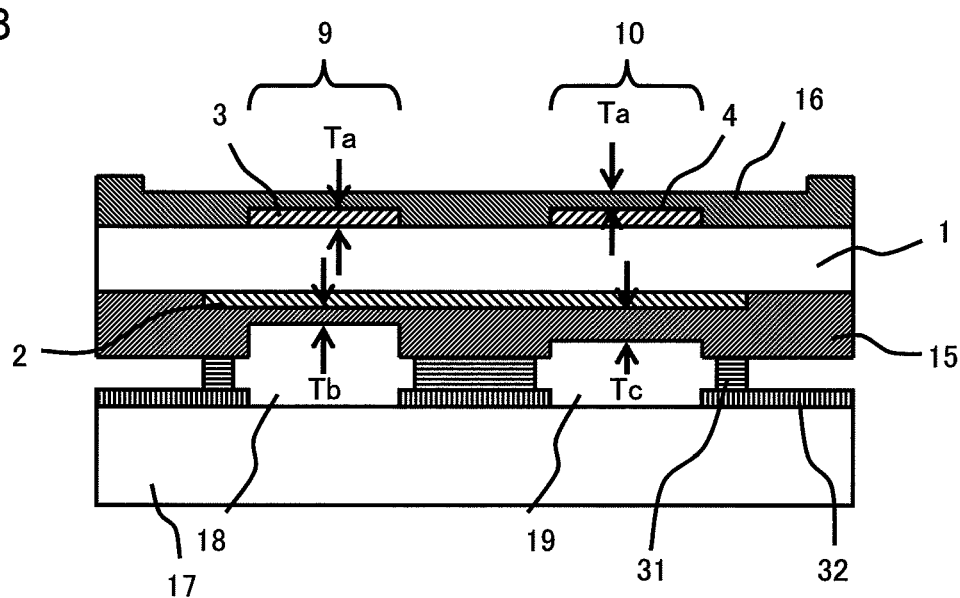
FIG. 8 is a cross-sectional view showing another supporting structure of the piezoelectric filter in accordance with the second embodiment of the present invention.

FIG. 8 is a cross-sectional view that shows another supporting structure of the piezoelectric filter in accordance with the second embodiment. This structure corresponds to a cross-sectional structure in which a transferring technique is utilized so as to produce the piezoelectric filter in accordance with the second embodiment of the present invention. A lower load film 15 is formed on the substrate 17, with first and second supporting portions 31 and 32 joined thereto being interposed therebetween. Moreover, on this, a lower electrode 2, a piezoelectric element 1, upper electrodes 3 and 4 and an upper load film 16 are formed so that first and second piezoelectric vibrators 9 and 10 are configured. Here, between the substrate 17 and the lower load film 15, void portions 18 and 19 are formed. In this case, the upper load film 16 is commonly used in the first and second piezoelectric vibrators, with the same thickness, so that it is possible to reduce the number of processes required after the processes for forming the void portions 18 and 19, and consequently to suppress a reduction in the yield.

Referring to one example of a process flow chart using the transferring technique shown in FIGS. 9 and 10, the following description will discuss the mechanism thereof.

Figure 9A:
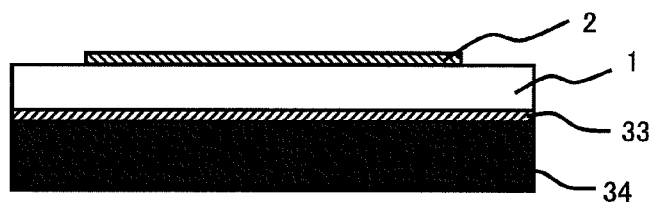
FIGS. 9A to 9F are views that show a process flow chart in still another supporting structure of the piezoelectric filter in accordance with the second embodiment of the present invention.

(a) As shown in FIG. 9A, an upper electrode 33, a piezoelectric element 1 and a lower electrode 2 are successively film-formed on a substrate 34, and the lower electrode 2 is subjected to a patterning process.

Figure 9B:
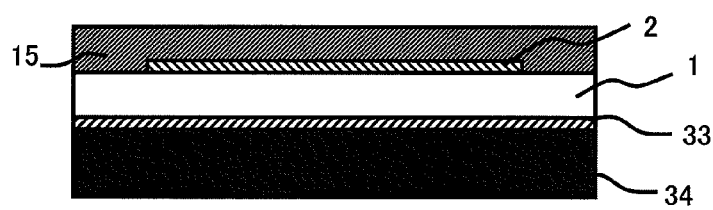

(b) Next, as shown in FIG. 9B, a lower load film 15 (first load film) is formed thereon.

Figure 9C:
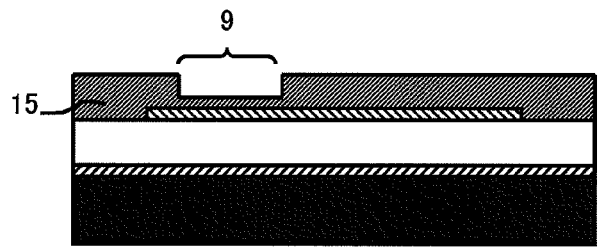
Figure 9D:
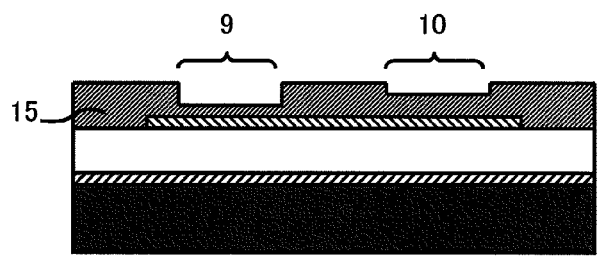

(c) Next, as shown in FIGS. 9C and 9D, the thickness of the lower load film 15 formed on the respective formation areas of the first and second piezoelectric vibrators 9 and 10 is adjusted by using an etching process or the like to have different thicknesses with respect to the first and second piezoelectric vibrators 9 and 10. Here, those areas in which the thickness of the lower load film 15 is adjusted as described above are defined as "adjusted areas", and the other areas are defined as "non-adjusted areas".

Figure 9E:
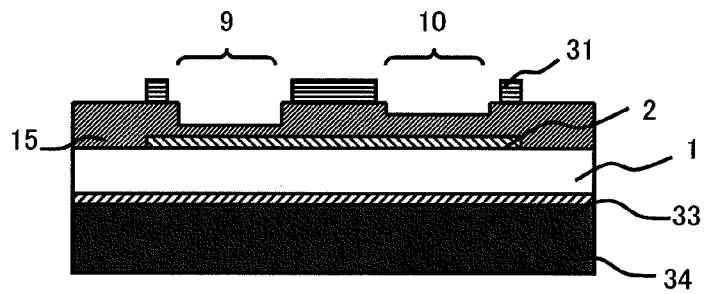

(d) Next, as shown in FIG. 9E, a first supporting portion 31 is formed on the non-adjusted areas of the lower load film 15.

Figure 9F:

(e) Next, as shown in FIG. 9F, a second supporting portion 32 is formed on another substrate 17.

Figure 10A:
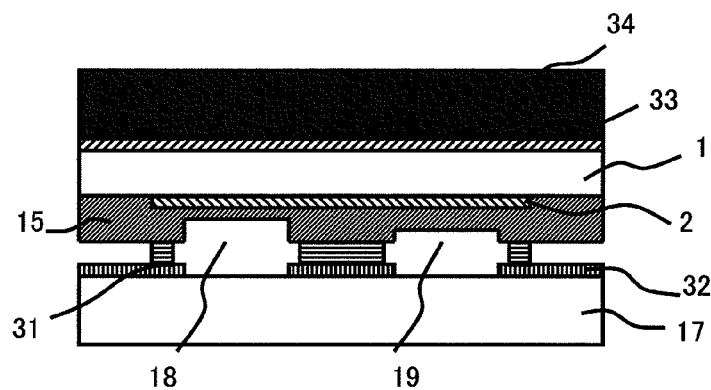
FIGS. 10A to 10E are views that show a process flow chart in yet another supporting structure of the piezoelectric filter in accordance with the second embodiment of the present invention.

(f) Next, as shown in FIG. 10A, the two substrates, produced in FIGS. 9E and 9F, are joined to each other at the first supporting portion 31 and the second supporting portion 32. At this time, void portions 18 and 19 are formed between the two substrates.

Figure 10B:
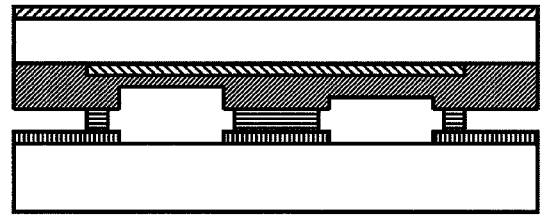

(g) Next, as shown in FIG. 10B, the substrate 34 is removed, and a thin-film structure made up of the lower electrode 2, the piezoelectric element 1 and the upper electrode 33 is transferred.

Figure 10C:
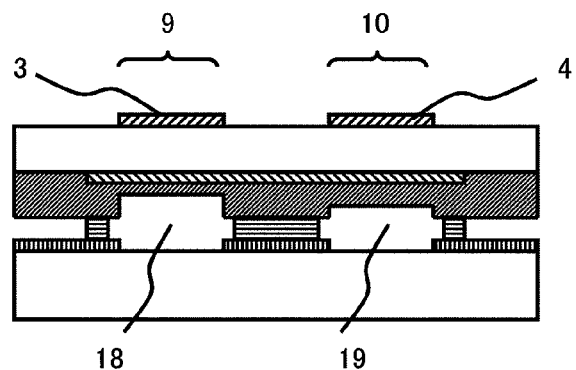

(h) Moreover, as shown in FIG. 10C, by forming the upper electrodes 3 and 4 in a manner so as to leave areas opposing the void portions 18 and 19, the first and second piezoelectric vibrators 9 and 10, made up of the lower electrode 2, the piezoelectric element 1 and the upper electrodes 3 and 4, are respectively formed.

Figure 10D:
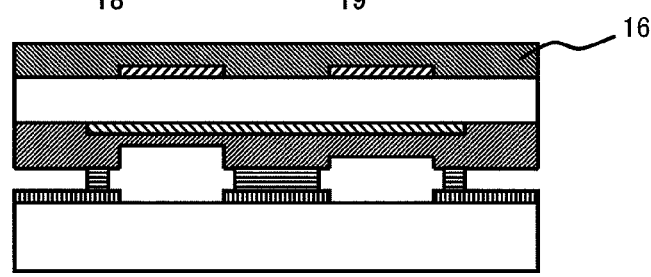
Figure 10E:
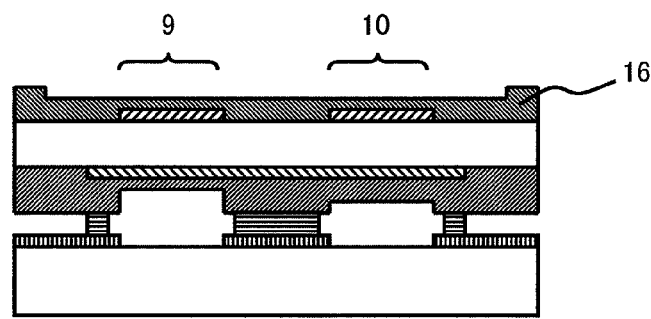

(i) Next, as shown in FIG. 10D, the upper load film 16 (second load film) is formed in a manner so as to cover the first and second piezoelectric vibrators respectively, and as shown in FIG. 10E, the thicknesses of the upper load film 16 on the first and second piezoelectric vibrators 9 and 10 are adjusted to the same value by using a single process.

With this arrangement, a piezoelectric filter in which the first and second piezoelectric vibrators 9 and 10 are allowed to have respectively different thicknesses of the lower load film 15, with the thicknesses of the upper load film 16 being made equal to each other, can be realized. Here, by reducing the number of adjusting operations of the upper load film 16 that are the final processes, the number of processes to be carried out in a state where a thin-film structure made up of the lower electrode 2, the piezoelectric element 1 and the upper electrode 33 (3, 4) is supported on the void portions 18 and 19, after the removal of the substrate 34, can be reduced. Therefore, by adjusting the thicknesses of the upper load film and the lower load film, it becomes possible to improve the coupling coefficient and also to improve the yield in comparison with a conventional structure.

Reference Example

Here, for use in comparison with the piezoelectric filter relating to the second embodiment, FIGS. 20 and 21 show a method for manufacturing a piezoelectric filter of a reference example. FIGS. 20 and 21 show one example of a process flow chart using the transferring technique.

Figure 20A:
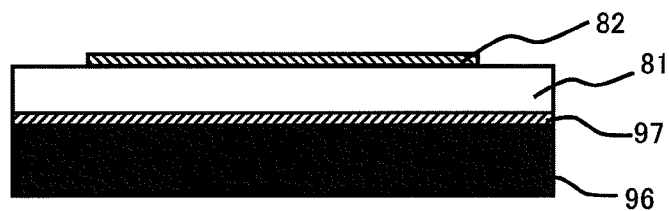
FIGS. 20A to 20E are views that show a process flow chart of a piezoelectric filter of a reference example in which a transferring technique is used.

(a) As shown in FIG. 20A, an upper electrode 97, a piezoelectric element 81 and a lower electrode 82 are successively film-formed on a substrate 96, and the lower electrode 82 is subjected to a patterning process.

Figure 20B:
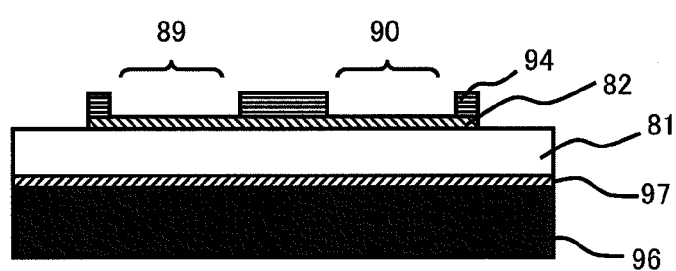

(b) Next, as shown in FIG. 20B, a first supporting portion 94 is formed on the lower electrode 82.

Figure 20C:
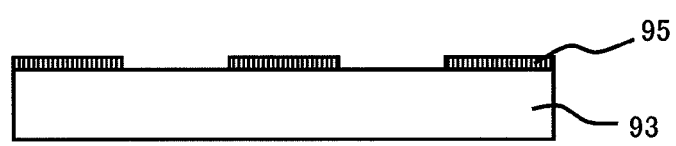

(c) Next, as shown in FIG. 20C, a second supporting portion 95 is formed on another substrate 93.

Figure 20D:
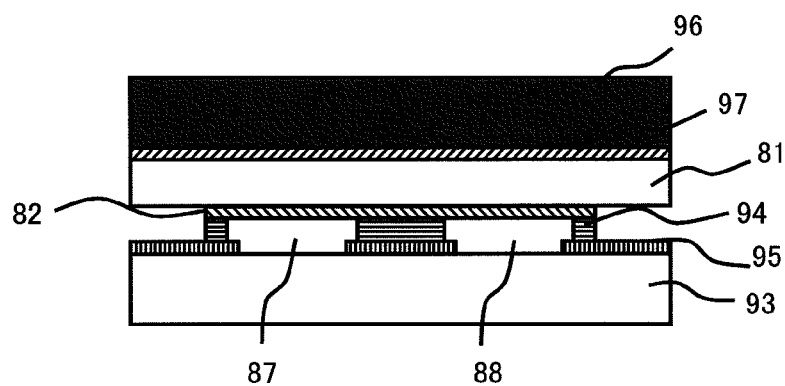

(d) Next, as shown in FIG. 20D, the two substrates, produced in FIGS. 20B and 20(c), are joined to each other at the first supporting portion 94 and the second supporting portion 95. At this time, void portions 87 and 88 are formed between the two substrates.

Figure 20E:
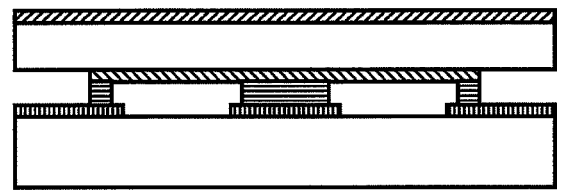

(e) Next, as shown in FIG. 20E, the substrate 96 is removed, and a thin-film structure made up of the lower electrode 82, the piezoelectric element 81 and the upper electrode 97 is transferred.

Figure 21A:
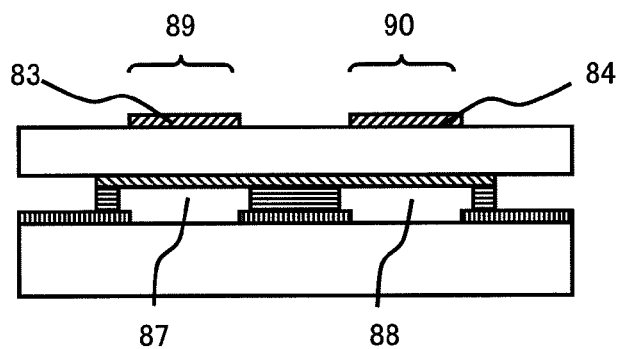
FIGS. 21A to 21D are views that show a process flow chart of a piezoelectric filter of another reference example in which the transferring technique is used.

(f) Moreover, as shown in FIG. 21A, by forming the upper electrodes 83 and 84 in a manner so as to leave areas opposing to the void portions 87 and 88, the first and second piezoelectric vibrators 89 and 90, made up of the lower electrode 82, the piezoelectric element 81 and the upper electrodes 83 and 84, are respectively formed.

Figure 21B:
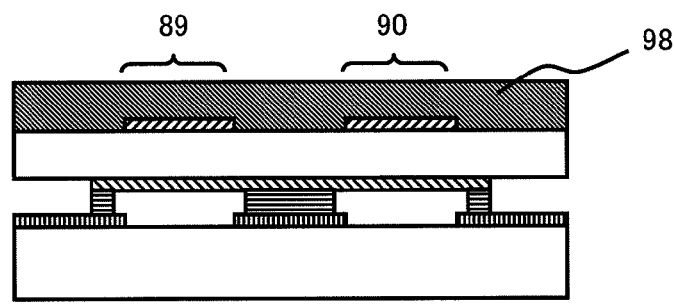
Figure 21C:
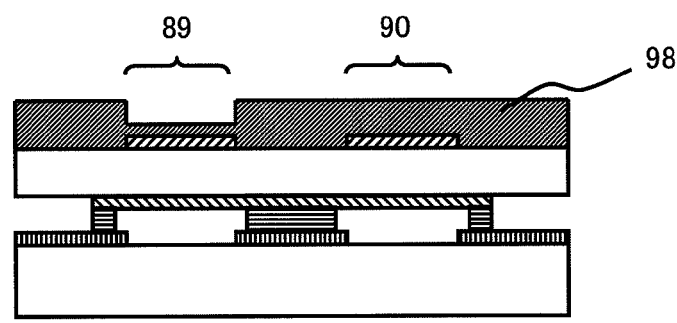
Figure 21D:
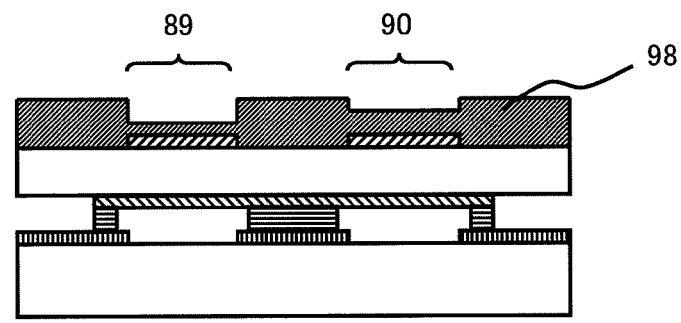

(g) Next, as shown in FIG. 21B, a load film 98 is formed in a manner so as to cover the first and second piezoelectric vibrators, and as shown in FIGS. 21C and 21D, the thicknesses of the load film 98 on the first and second piezoelectric vibrators 89 and 90 are adjusted respectively.

Thus, the load film 98 having different thicknesses on the first and second piezoelectric vibrators 89 and 90 is formed so that a piezoelectric filter in which piezoelectric vibrators having different resonance frequencies are connected to each other can be realized.

However, in the above-mentioned manufacturing method, after the removal of the substrate 96 in FIG. 20E, the succeeding processes need to be carried out, with the thin-film structure made up of the lower electrode 82, the piezoelectric element 81 and the upper electrode 97 (83, 84) being supported on the void portions 87 and 88, with the result that, as the number of the processes increases, the possibility of causing damages becomes higher. As a result, in the piezoelectric filter in the reference example, the yield might be reduced to a great degree in comparison with that of the piezoelectric filter in accordance with the second embodiment.

Third Embodiment

Figure 11:
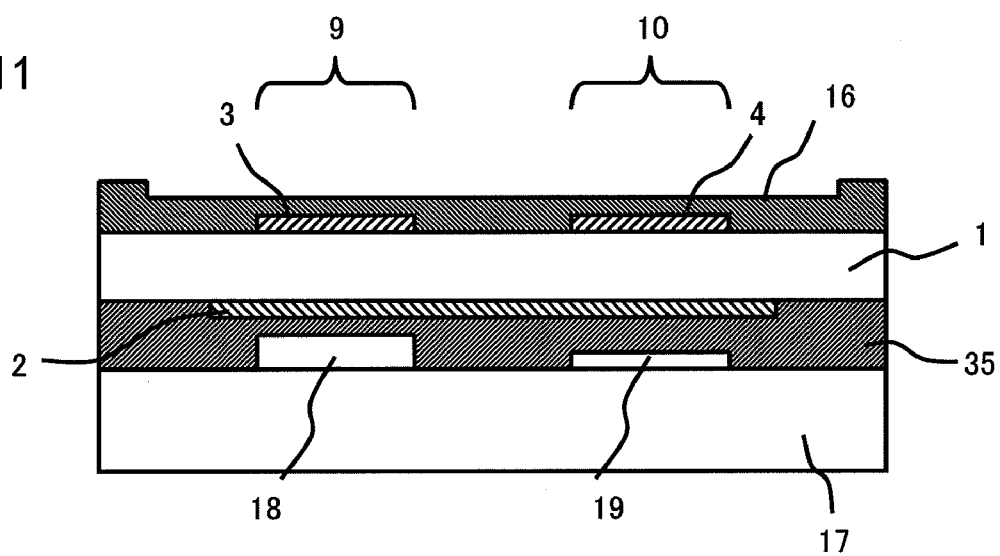
FIG. 11 is a cross-sectional view that shows a supporting structure of a piezoelectric filter in accordance with a third embodiment of the present invention.

FIG. 11 is a cross-sectional view showing a supporting structure of a piezoelectric filter in accordance with a third embodiment of the present invention. The structure in which the first and second piezoelectric vibrators 9 and 10 are formed on a substrate is the same as that of the second embodiment. As shown in FIG. 11, on a substrate 17, a lower load film 35 (first load film) is formed, and on the lower load film 35, a lower electrode 2, a piezoelectric element 1, upper electrodes 3 and 4, and an upper load film 16 (second load film) are formed. Here, the thicknesses of the upper load film 16 are made to be the same on the respective first and second piezoelectric vibrators 9 and 10. Moreover, in the same manner as in the transferring method shown in FIGS. 9 and 10, the thickness of the lower load film 35 on areas corresponding to the formation areas of the first and second piezoelectric vibrators 9 and 10 are preliminarily adjusted by an etching process on another substrate, and this is then joined to the substrate 17. After having been adjusted by the etching process, the lower load film 35 is directly joined to the substrate 17. Thus, in the areas having reduced thicknesses by the etching process, that is, between the adjusted areas of the lower load film 35 and the substrate 17, the void portions 18 and 19 are formed in a divided manner. In this case, the areas in the lower load film 35 where the thickness is not unadjusted, that is, the non-adjusted areas of the lower load film 35, as it is, forms a supporting portion, and the non-adjusted areas serving as the supporting portion are directly joined to the substrate 17. Thus, it becomes possible to eliminate the processes for forming the first and second supporting portions in the transferring method shown in the second embodiment of the present invention. Here, with respect to the structure in which the first and second piezoelectric vibrators 9 and 10 are formed on the substrate 17, since the same structure as that of the second embodiment is used, it becomes possible to suppress degradation of the coupling coefficient and also to improve the yield in the transferring method.

Fourth Embodiment

Figure 12:
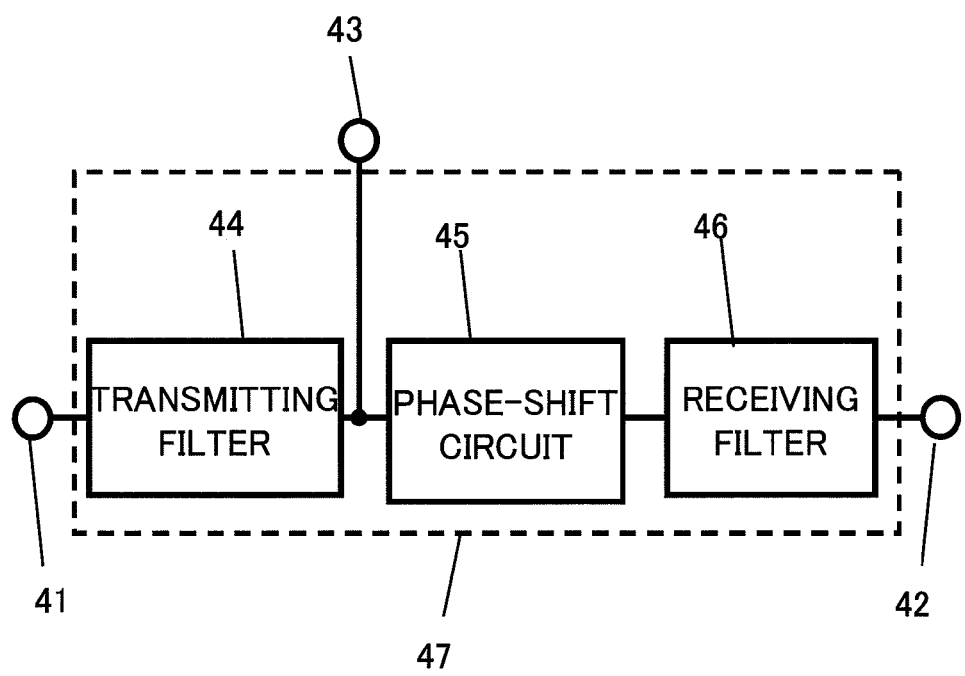
FIG. 12 is a block diagram that shows a structural example of a shared device provided with the piezoelectric filter of the present invention.

FIG. 12 is a block diagram that shows high-frequency circuit parts in accordance with a fourth embodiment of the present invention. The piezoelectric filter in each of the embodiments of the present invention may be applied to an antenna shared device 47 as shown in FIG. 12. The antenna shared device 47 of this figure is provided with a transmitting terminal 41, a receiving terminal 42 and an antenna terminal 43, and a transmitting filter 44, a phase-shift circuit 45 and a receiving filter 46 are disposed between the transmitting terminal 41 and the receiving terminal 42 in this order. The antenna terminal 43 is connected between the transmitting filter 44 and the phase-shift circuit 45. At least either one of the transmitting filter 44 and the receiving filter 46 is provided with the piezoelectric filter relating to any one of the embodiments.

Figure 13:
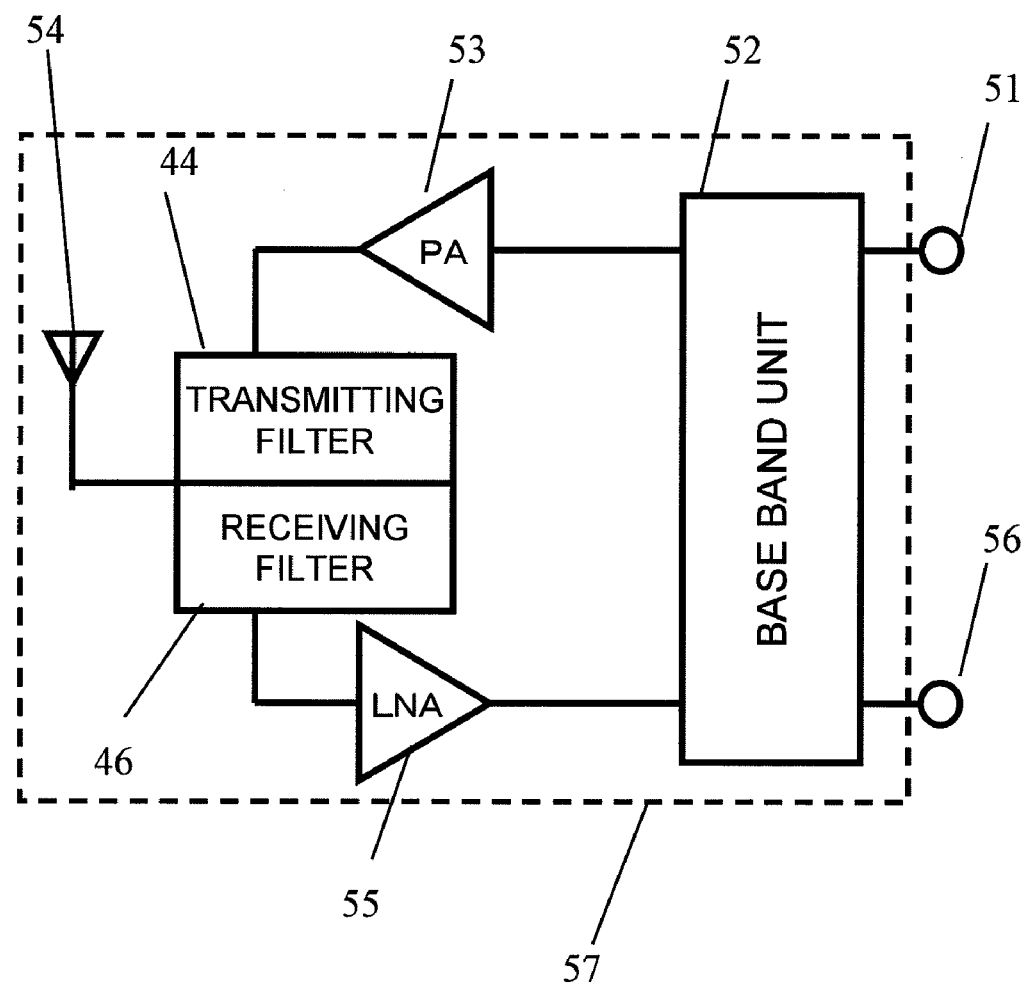
FIG. 13 is a block diagram that shows a structural example of a communication apparatus provided with the piezoelectric filter of the present invention.
Figure 15:
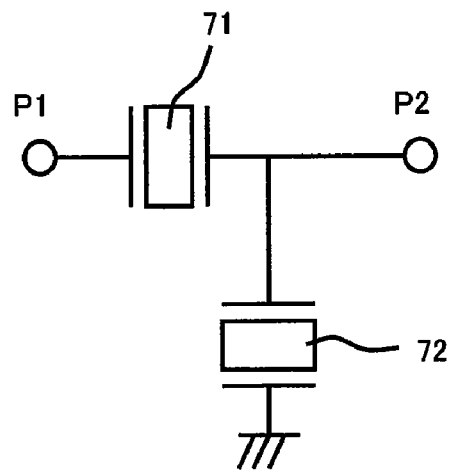
FIG. 15 is a block diagram that shows a filter in which the conventional piezoelectric vibrator is used.
Figure 16:
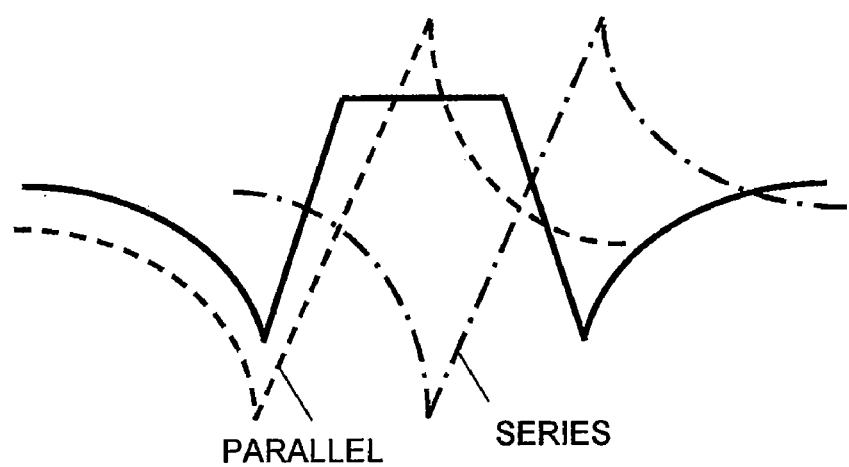
FIG. 16 is a diagram that shows a penetration characteristic of the filter of FIG. 12.
Figure 17:
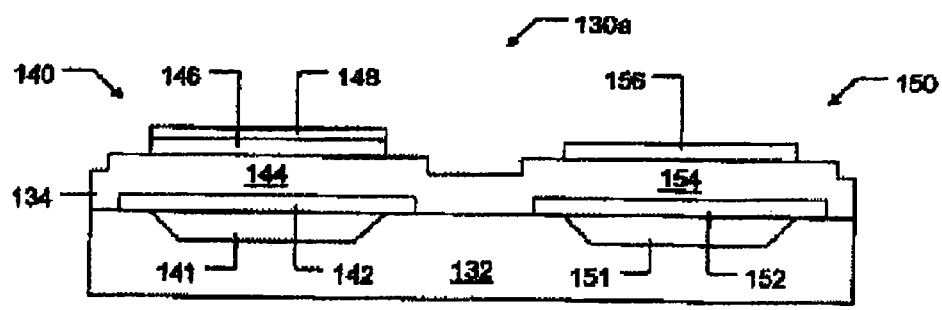
FIG. 17 is a cross-sectional view that shows a frequency adjusting method for a conventional piezoelectric filter.
Figure 18:
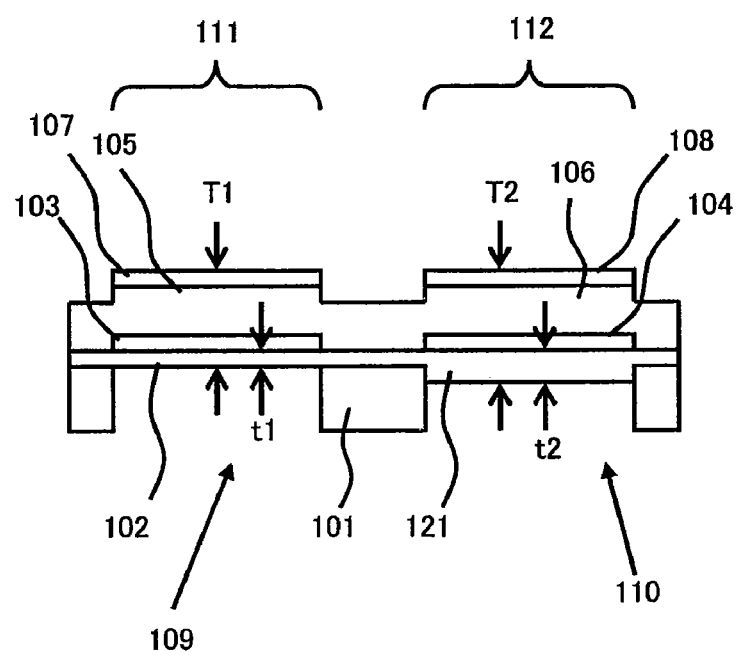
FIG. 18 is a cross-sectional view that shows a frequency adjusting method for another conventional piezoelectric filter.
Figure 19A:
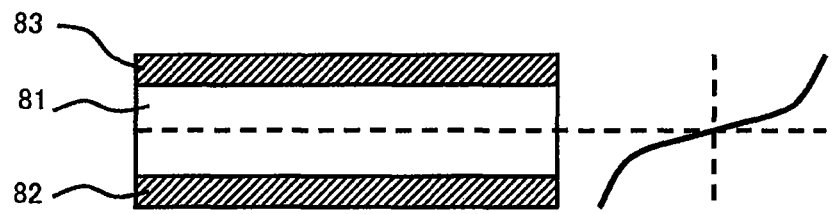
FIG. 19A is a cross-sectional view that shows a conventional optimal piezoelectric vibrator prior to a frequency adjustment and a schematic diagram that shows its vibration mode.
Figure 19B:
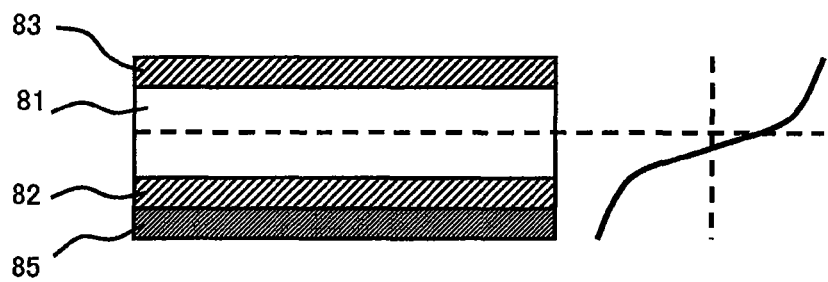
FIG. 19B is a cross-sectional view showing the conventional piezoelectric vibrator that has been subjected to the frequency adjustment and a schematic diagram that shows its vibration mode.
Figure 19C:
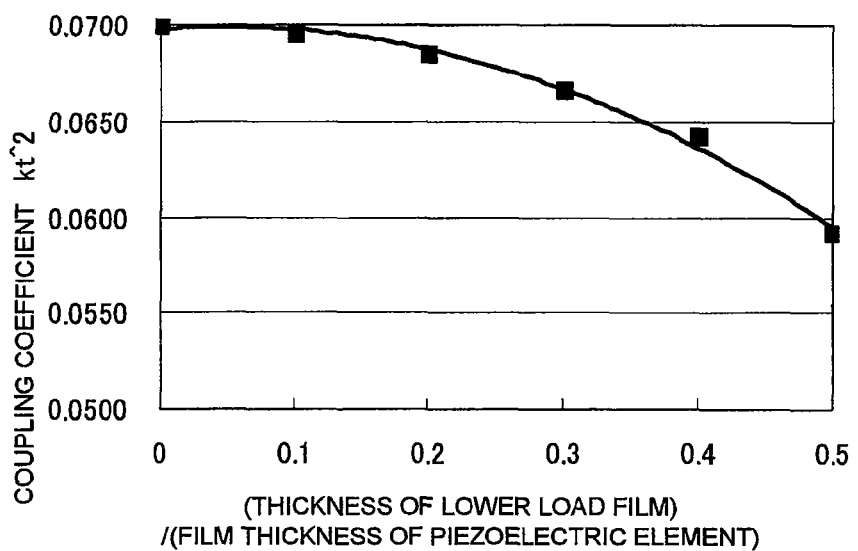
FIG. 19C is a graph showing the results of simulation of the coupling coefficient of the conventional piezoelectric vibrator that has been subjected to the frequency adjustment.

Moreover, the piezoelectric filter in each of the embodiments of the present invention may be applied to a communication apparatus 57 as shown in FIG. 13. In the communication apparatus 57 of this figure, a signal, inputted through a transmitting terminal 51, is allowed to pass through a base band unit 52, and the signal is amplified by a power amplifier 53, and filtered through the transmitting filter 44 so that electric waves are transmitted from an antenna 54. Moreover, a signal, received from the antenna 54, is allowed to pass through the receiving filter 46 to be filtered, and is then amplified by an LNA 55, and transmitted to a receiving terminal 56 through the base band unit 52. The piezoelectric filter according to any one of the embodiments is used as at least one of the transmitting filter 44 and the receiving filter 46.

The piezoelectric filter of the present invention makes it possible to provide a piezoelectric vibrator that can maintain a board-band characteristic even after a frequency adjustment. Moreover, it is possible to improve the yield by using a transferring technique upon manufacturing a piezoelectric filter, and consequently to provide the device at low costs. Therefore, it can be effectively applied to high-frequency circuit parts, such as high-frequency filters and shared devices, as well as to low-loss filters and communication apparatuses, which have a low-loss characteristic, an abrupt skirt characteristic and a superior damping characteristic.

The invention claimed is:

1. A piezoelectric filter comprising:
  first and second piezoelectric vibrators, each having:
    a substrate;
    a lower load film formed on the substrate;
    a lower electrode formed on the lower load film;
    a piezoelectric element formed on the lower electrode;
    an upper electrode formed on the piezoelectric element; and
    an upper load film formed on the upper electrode,
  wherein the piezoelectric filter is formed by electrically connecting the first and second piezoelectric vibrators, and
  wherein the piezoelectric element of the first piezoelectric vibrator and the piezoelectric element of the second piezoelectric vibrator correspond to respectively different areas of the same piezoelectric element, and
  wherein resonance frequencies of the first and second piezoelectric vibrators are adjusted by the respective lower load film and upper load film of the first piezoelectric vibrator and the second piezoelectric vibrator so that the resonance frequencies of the first and second piezoelectric vibrators are made different from each other.

2. The piezoelectric filter according to claim 1, wherein the thickness of the upper load film of the first piezoelectric vibrator and the thickness of the upper load film of the second piezoelectric vibrator are made equal to each other, and the thickness of the lower load film of the first piezoelectric vibrator and the thickness of the lower load film of the second piezoelectric vibrator are made different from each other.

3. The piezoelectric filter according to claim 2, wherein the upper load film of the first piezoelectric vibrator and the upper load film of the second piezoelectric vibrator are made from the same material, and the lower load film of the first piezoelectric vibrator and the lower load film of the second piezoelectric vibrator are made from the same material.

4. The piezoelectric filter according to claim 3, wherein, supposing that the thickness of each of the upper load films of the first and second piezoelectric vibrators is Ta, the thickness of the lower load film of the first piezoelectric vibrator is Tb, the thickness of the lower load film of the second piezoelectric vibrator is Tc, the sound velocity of each of the upper load films of the first and second piezoelectric vibrators is va and the sound velocity of each of the lower load films of the first and second piezoelectric vibrators is vb, the following expression is satisfied:

$$Tb \times va/vb < Ta < Tc \times va/vb.$$

5. The piezoelectric filter according to claim 4, wherein the piezoelectric filter adjusts resonance frequencies of the first and second piezoelectric vibrators by respectively adjusting the thickness of the lower load film of the first piezoelectric vibrator and the thickness of the lower load film of the second piezoelectric vibrator;
  wherein the first and second piezoelectric vibrators are formed on the substrate with a supporting portion interposed therebetween;
  wherein the supporting portion is formed by joining a first supporting portion formed on the substrate to a second supporting portion formed on a non-adjusted area in which the thicknesses of the lower load films of the first and second piezoelectric vibrators are unadjusted; and
  wherein an adjusted area in which the thicknesses of the lower load films of the first and second piezoelectric vibrators are adjusted is allowed to face the substrate, with a void portion being interposed therebetween.

6. The piezoelectric filter according to claim 4, wherein the piezoelectric filter adjusts resonance frequencies of the first and second piezoelectric vibrators by respectively adjusting the thickness of the lower load film of the first piezoelectric vibrator and the thickness of the lower load film of the second piezoelectric vibrator;
  wherein the first and second piezoelectric vibrators are formed on the substrate with a supporting portion interposed therebetween;
  wherein the supporting portion is formed by a non-adjusted area in which the thicknesses of the lower load films are unadjusted;
  wherein the non-adjusted area of the lower load films and the substrate are directly joined to each other; and
  wherein an adjusted area in which the thicknesses of the lower load films of the first and second piezoelectric vibrators are adjusted is allowed to face the substrate, with a void portion being interposed therebetween.

7. The piezoelectric filter according to claim 4, wherein the upper load films of the first and second piezoelectric vibrators and the lower load films of the first and second piezoelectric vibrators are made from the same material.

8. The piezoelectric filter according to claim 4, wherein the upper load films of the first and second piezoelectric vibrators and the lower load films of the first and second piezoelectric vibrators are made from mutually different materials.

9. The piezoelectric filter according to claim 1, wherein a void portion is placed between the substrate and the first and second piezoelectric vibrators.

10. The piezoelectric filter according to claim 9, wherein the void portion is formed by a transferring method.

11. A method for manufacturing a piezoelectric filter having: a first piezoelectric vibrator formed with a first area of a piezoelectric element being interposed therebetween, and a second piezoelectric vibrator formed with a second area of the piezoelectric element being interposed therebetween, wherein the step of forming the first piezoelectric vibrator, with the first area of the piezoelectric element being interposed therebetween, further comprises:

forming an upper electrode on one of main faces of the first area of the piezoelectric element;

forming a lower electrode on the other main face of the first area of the piezoelectric element;

forming an upper load film on a face opposing a face of the upper electrode that is made in contact with the piezoelectric element; and forming a lower load film on a face opposing a face of the lower electrode that is made in contact with the piezoelectric element, and wherein the step of forming the second piezoelectric vibrator, with the second area of the piezoelectric element being interposed therebetween, further comprises:

forming an upper electrode on one of main faces of the second area of the piezoelectric element;

forming a lower electrode on the other main face of the second area of the piezoelectric element;

forming an upper load film on a face opposing a face of the upper electrode that is made in contact with the piezoelectric element; and forming a lower load film on a face opposing a face of the lower electrode that is made in contact with the piezoelectric element, and wherein, in the step of forming the respective upper load film or lower load film of the first piezoelectric vibrator and the second piezoelectric vibrator, or in the succeeding step thereof, the thicknesses of the upper load film and the lower load film are adjusted so that a resonance frequency of the first piezoelectric vibrator and a resonance frequency of the second piezoelectric vibrator are made different from each other.

12. A high-frequency circuit part comprising: the piezoelectric filter disclosed in claim 1.

13. A communication apparatus provided with an antenna, a transmitting circuit and a receiving circuit, comprising: the high-frequency circuit part disclosed in claim 12, that is installed in a connecting portion between the antenna and the transmitting circuit or the receiving circuit, or in at least either one of the transmitting circuit and the receiving circuit.

* * * * *